United States Patent [19]

van de Grift et al.

[11] Patent Number: 4,845,462
[45] Date of Patent: Jul. 4, 1989

[54] LINEAR INTEGRATED RESISTOR

[75] Inventors: Robert E. J. van de Grift; Martien van der Veen, both of Eindhoven, Netherlands

[73] Assignee: U.S. Philips Corporation, New York, N.Y.

[21] Appl. No.: 216,937

[22] Filed: Jul. 8, 1988

[30] Foreign Application Priority Data

Jul. 10, 1987 [NL] Netherlands .......................... 8701636

[51] Int. Cl.[4] .............................................. H01C 1/14
[52] U.S. Cl. .................................... 338/323; 338/325; 357/51
[58] Field of Search ............... 338/323, 324, 325, 327, 338/328, 331, 322, 333, 334, 127, 140, 185; 357/51; 341/153, 154

[56] References Cited

U.S. PATENT DOCUMENTS

| | | | |
|---|---|---|---|
| 3,362,851 | 1/1968 | Dunster | 338/327 X |
| 3,727,165 | 4/1973 | Hagen | 338/325 X |
| 4,439,753 | 3/1984 | Kawawa | 338/325 |

*Primary Examiner*—C. L. Albritton
*Attorney, Agent, or Firm*—Thomas A. Briody; Jack E. Haken; Jack D. Slobod

[57] ABSTRACT

An integrated resistor is constituted by a doped resistance body in a semiconductor substrate which is coated with a layer of insulating material having local apertures in which metal end contacts (2a, 3a) and tapping contacts (4a, 5a, 6a) are provided. The width of each tapping contact (4a, 5a, 6a) is smaller than the width of the doped zone and, viewed in the longitudinal direction of the resistance body, the tapping contacts (4a, 5a, 6a) do not overlap.

7 Claims, 3 Drawing Sheets

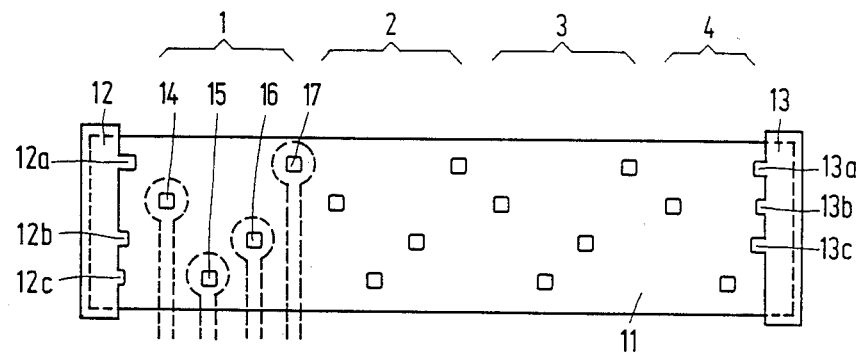
FIG.5
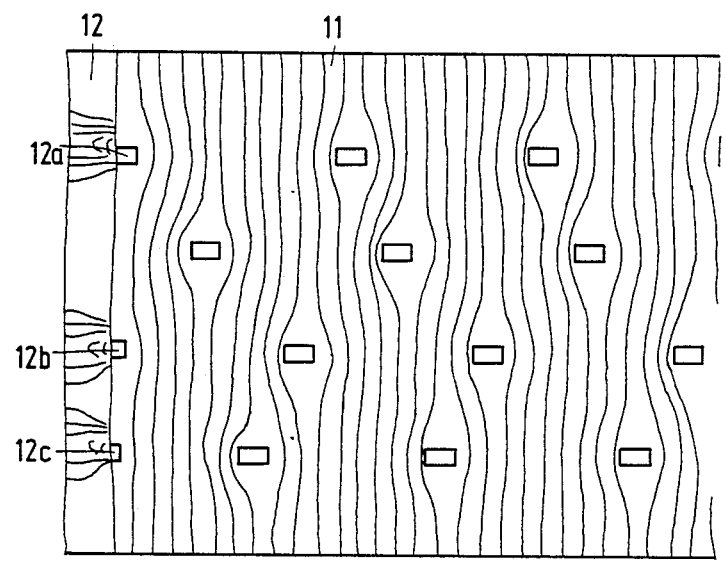
FIG.6
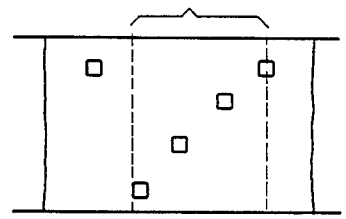   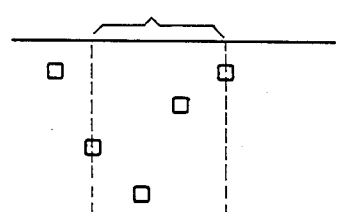
FIG.7a            FIG.7b

LINEAR INTEGRATED RESISTOR

BACKGROUND OF THE INVENTION

1. Field of the Invention

The invention relates to a tapped linear integrated resistor comprising a doped resistance body in a semiconductor substrate coated with a layer of insulating material having local apertures in which the metal end contacts and tapping contacts are provided on the surface of the resistance body.

2. DESCRIPTION of the Related Art

Tapped linear integrated resistors are generally known and may be used in integrated circuits as voltage dividers, for example for obtaining accurately known fractional voltages in A/D and D/A converters.

A thin vapour-deposited metal layer is generally used as a resistance body on which teappings are provided. However, in the conventional manufacturing processes it appears to be very difficult to manufacture such a layer with sufficient accuracy, resulting in a spread of the resistance occurring in the resistance body, which leads to non-linearity of the resistor tappings.

If a doped resistance zone is used, its manufacturing process can be monitored well enough so that the above-mentioned spread problems do not occur or hardly occur. But on the other hand the length of the doped resistance body must be small for sufficiently low resistivity of the resistor (and also for limiting the dimensions of the chip on which the resistor is arranged), so that the tapping contacts of the resistor must be arranged relatively close to one another.

In the known tapped diffusion resistors the tapping contacts are provided in the form of relatively narrow metal strips extending across the width of the diffused resistance zone. Due to the limited accuracy of the lithographic techniques with which these metal strips are provided on the resistance body, errors relating to both the dimensions and the position of the metal strips occur. Particularly if these strips must be arranged close to one another, these dimensioning and positioning errors result in a relatively large non-linearity in the ultimate tapping ratios. Moreover, the current through the resistance body will predominantly concentrate directly under the tapping contacts in a relatively small cross-section directly under and next to the relevant contact. The resultant inhomogeneity in the field distribution within the resistance body also contributes to non-linearity of the resistor. Practice has proved that the known doped resistors of this type do not comply with the relatively stringent linearity requirements imposed in many applications such as in A/D and D/A converters.

SUMMARY OF THE INVENTION

It is an object of the invention to provide a method of considerably reducing the influence of dimensioning and positioning errors of the tapping contact elements on the resistance body so that a resistor having a higher linearity is obtained.

According to the invention the tapped linear integrated resistor as described in the opening paragraph is characterized in that the width of each tapping contact is smaller than the width of the doped zone and in that, viewed in the longitudinal direction of the resistance body, the tapping contacts of adjacent tappings do not overlap.

Since the tapping elements of adjacent tapping contacts do not overlap, the distance, as viewed in the longitudinal direction, between tapping contacts which do overlap will be much larger so that the influence of dimensioning and positioning errors of the tapping contacts is considerably reduced and the linearity of the resistor is improved.

The tapping contacts are preferably distributed in one or more groups of tapping contacts which are located on a partial surface of the resistance body and which do not overlap within this partial surface, as viewed in the longitudinal direction of the resistance body.

If the tapping contacts can be arranged in a single group, or in other words, if the width of the resistance body is so large that all required tapping contacts can be arranged thereon without their overlapping, as viewed in the longitudinal direction, a situation is created in which mainly the relatively large distance to both the sideways located terminals and to the two end contacts is decisive for the tapping ratio of the tapping contacts and the dimensioning and positioning errors of the tapping contacts exert relatively little influence thereon. In this case the influence of tolerance errors during the manufacturing process is thus minimized.

However, if the number of required tapping contacts is larger than can be accommodated in a single group, the division into sub-groups in the manner described has the result that, viewed in the longitudinal direction, only a small number of overlapping tapping contacts is present in each group and they are also relatively far removed from one another. This particularly applies if the dimensions of the tapping contacts as well as the number of tapping contacts in each group are chosen in such a manner that the tapping contacts occupy all possible positions which are available for a group in the direction of width.

Since the tapping contacts according to the invention are relatively small, the disturbances of the field line pattern within the resistance body caused thereby are also small and since the tapping contacts, viewed in the longitudinal direction of the resistor, do not overlap or only overlap at a large distance, disturbances caused by a tapping contact do not substantially influence an adjacent contact. The possible influence may be still further reduced by increasing the distance between adjacent contacts in an absolute sense. It is therefore preferred to spread the tapping contacts over the surface of the resistance body in such a way that the average space between a tapping contact and the tapping contacts of the directly adjacent tappings is as large as possible.

In order to obtain a uniform current density throughout the width at the two ends of the resistance body, and hence to generate a field line pattern in the whole resistance body which is as uniform as possible, the two end contacts extend across the width of the resistance body. It could then be that the disturbance of the field line pattern, caused by the tapping contact which is closest to an end contact, has a detrimental influence on the accuracy of this last section of the tapping resistor. In order to at least partly eliminate this field disturbance, particularly of those tapping contacts which are located in the vicinity of an end contact, it is preferred to form the end contacts as strips extending across the width of the doped zone and provided, on the side facing the other end contact, with one or more projecting portions facing the other end contact, with which portions the field in the resistance body is perturbed in such a way that the disturbance caused by the nearest tapping contacts is substantially eliminated.

BRIEF DESCRIPTION OF THE DRAWINGS

The invention will now be described in greater detail by way of example with reference to the accompanying drawings in which FIG. 5 shows a further embodiment of a resistor according to the invention, FIG. 6 shows the variation of the equipotential lines in the resistor according to FIG. 5, obtained by means of a computer simulation, FIG. 7 shows other possible tapping contact patterns, the pattern of FIG. 7b being preferred to that of FIG. 7a, FIG. 8 shows an A/D converter of a type in which the diffusion resistor according to the invention can be used advantageously, and FIG. 9 graphically illustrates the improvement of the linearity which is achieved by the particular design of the end contacts according to the invention.

DESCRIPTION OF THE PREFERRED EMBODIMENTS

Figure 1:
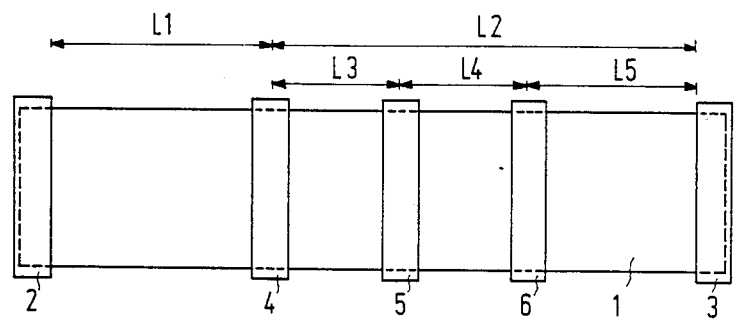
FIG. 1 is a plan view of a known diffusion resistor.
Figure 2:
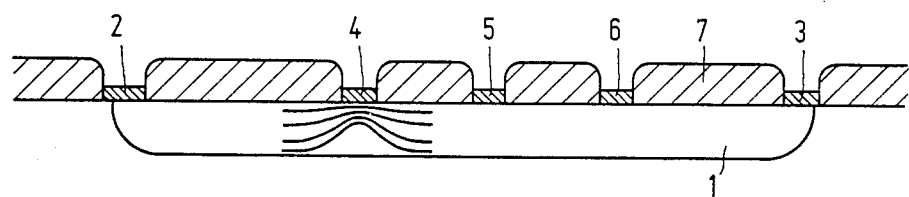
FIG. 2 is a longitudinal section through the known diffusion resistor of FIG. 1.

FIG. 1 is a plan view of a known diffusion resistor (without a protective insulation layer) comprising the diffused resistance zone 1, the end contacts 2 and 3 and a plurality of tapping contacts 4, 5 and 6. All contacts extend across the width of the resistance body. Although the term "diffusion resistor" is generally used for such resistors, they may be obtained not only by means of a diffusion process but also by other processes such as ion implantation. Although it would be expected that the voltages taken from, for example tapping contact 4 is equal to $L1/(L1+L2)$ times the voltage across the end contacts, this is found to be only approximately true. The cause of the non-linearity which occurs can be explained with reference to FIG. 2 showing the resistor of FIG. 1 in a longitudinal section. In addition to the diffusion zone 1, the end contacts 2 and 3 and the tapping contacts 4, 5 and 6, FIG. 2 also shows the parts of the insulation layer 7 present on the resistance body.

If a voltage is applied between the end contacts 2 and 3 and if fractional voltages are derived via the tapping contacts 4, 5 and 6, further consideration of the entire configuration shows that the field lines in the actual resistance zone 1 are not parallel everywhere but have a tendency to bunch under each tapping contact, predominantly within a very small cross-section directly under and next to the relevant tapping contact. A number of field lines have been diagrammatically shown under the contact 4 in order to illustrate this effect. Consequently, the entire resistance body is divided, as it were, into subresistors whose actual resistance is considerably influenced by possible positioning and dimensioning errors of the adjacent tapping contacts.

The voltage at the tapping contact 4 is determined by $L1/(L1+L3+L4+L5)$. Errors may occur in any of these lengths and moreover errors may occur in the widths of the tapping contacts. In fact, a commutation of errors occurs, resulting in a non-linearity of the resistor. Particularly if the tapping contacts must be arranged relatively close to one another, with interspaces of the order of several microns, the influence of these errors caused by the limited accuracy of the lithographic techniques used is quite considerable.

Figure 3:
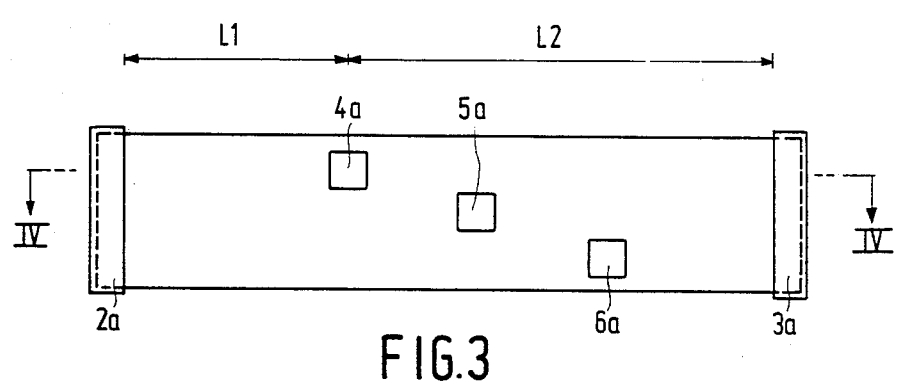
FIG. 3 is a plan view of a tapped linear diffusion resistor according to the invention.
Figure 4:
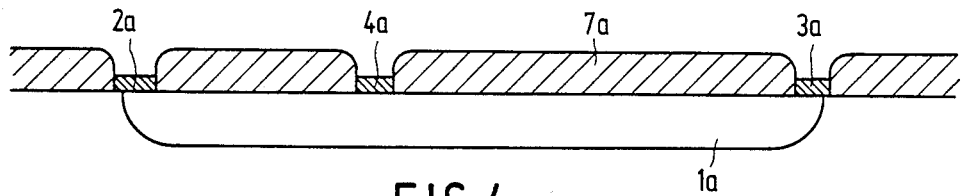
FIG. 4 is a cross-section taken on the line IV—IV in FIG. 3.

The inventive solution to this problem is illustrated in FIGS. 3 and 4 in which the resistance body is denoted by 1a, the end contacts by 2a and 3a, the tapping contacts by 4a, 5a and 6a and the insulation layer by 7a. In the embodiment shown in these Figures the dimensions of the tapping contacts 4a, 5a and 6a are chosen such that, viewed in the longitudinal direction of the resistance body, the tapping contacts do not overlap. The longitudinal section of FIG. 4 taken on the line IV—IV in FIG. 3 through the tapping contact 4a shows that the field lines will not be disturbed by other tapping contacts in the resistance body between the tapping contact 4a and the end contact 3a so that the tapping ratio of the tapping contacts is now determined by $L1/(L1+L2)$. Since these lengths will be relatively large, the possible, inevitable positioning and dimensioning errors of only the tapping contact 4a will play a role in the accuracy of the tapping ratio of this contact. The cumulative effect which occurred in the resistor according to FIGS. 1 and 2 is eliminated and the linearity of the resistor is considerably improved.

Given the main dimensions of the resistance body and given the practically realizable minimum dimensions of the tapping contacts, the number of required tappings will generally be so large that it is not always possible to arrange all tapping contacts so that they do not overlap. In these cases it is, however, possible to minimize the number of overlapping contacts and to prevent the contacts from influencing one another as little as possible by dividing the tapping contacts into groups which are each provided in a pre-determined pattern as is shown in the embodiment of FIG. 5.

The resistor of FIG. 5 has a doped resistance body 11 whose two ends carry the end contacts 12 and 13 which are also strip-shaped in this embodiment. The tapping contacts are sub-divided into groups (group 1, group 2, group 3, group 4) with four tapping contacts each. The tapping contacts of the extreme left group (group 1) are denoted by the reference numerals 14, 15, 16 and 17 in FIG. 5. The connections to these contacts are constituted by the conductor tracks located on the insulation layer (not shown in FIG. 3) some of which have been partly denoted by broken lines for illustrative purposes. The tapping contacts of the other groups are provided in the same pattern as the contacts 14, 15, 16 and 17 on the resistance body. In this example group 4 has only two tapping contacts.

Due to the sub-division into groups of juxtaposed tappings whose tapping contacts are spread over the surface of the resistance body in such a way that, viewed in the longitudinal direction of the resistor, they do not overlap within the group, the number of overlapping tapping contacts in any longitudinal section of the resistance body is reduced, whilst the interspace between these tapping contacts is also relatively large. The number of overlapping contacts will generally be the same as the number of groups into which the contacts have been divided, except when a group comprises fewer contacts than the nominal number. This is the case in FIG. 5 in which the contacts 14 and 15 overlap three other similar contacts of the other groups, whilst the contacts 16 and 17 only overlap with two other similar contacts.

FIG. 6 shows a variation of the equipotential lines in the resistance body obtained by means of computer-simulation, when using a pattern of tapping contacts as illustrated in FIG. 5. For the sake of clarity of the Figure the reference numerals 14, 15, 16 and 17 denoting the tapping contacts have been omitted. This graphic representation clearly shows that the chosen dimensioning of the tapping contacts and the chosen positioning of these contacts in a regularly distributed pattern renders the influence on the field lines relatively small because, certainly in the central part of the resistor, the disturbances are mutually counteracted and hence cancelled. Due to the relatively large interspace, as viewed in the longitudinal direction, the mutual influence of the overlapping contacts is considerably reduced.

FIG. 6 also shows that it is advantageous to render the absolute space between the contacts of adjacent tappings as large as possible. The said pattern is therefore preferably chosen to be such that the average space between a tapping contact and the tapping contacts of the directly adjacent tappings has a minimum spread. In this respect the pattern of FIG. 7a is thus much less satisfactory than the pattern illustrated in FIG. 5 or its alternative illustrated in FIG. 7b.

A relatively strong disturbance of the field line pattern still occurs in the proximity of the ends of the resistance zone and in order to achieve a further linearity improvement at that area, the end contacts 12 and 13 are provided with finger-shaped projecting portions, hitherto not described, which deliberately perturb the field in such a way that the disturbances caused by the tapping contacts are cancelled out. In FIGS. 5 and 6 these finger-shaped projections are denoted by 12a, 12b, 12c and 13a, 13b, 13c. As is evident from FIG. 6 these finger-shaped projecting end contact portions deliberately disturb the field in the resistance zone, which disturbance is just large enough to cancel out the disturbance caused by the nearest tapping contacts 14, 15, 16 and 17, particuarly contact 14. As is also evident from FIG. 6, the length of the fingershaped projecting portions is related to the distance between the relevant projecting portion and the adjacent tapping contact, as viewed in the longitudinal direction. Finger 12a has the largest distance (to contact 17) and is longest, finger 12c has the shortest distance (to contact 15) and is shortest. There is no projecting finger facing contact 14. These projecting fingers constitute, as it were, a continuation of the tapping contact pattern by which the peripheral effect caused by the interruption of the pattern at the end contacts is eliminated.

The favourable influence of these finger-shaped projection portions on the end contacts can be illustrated with reference to a diffusion resistor according to the invention used in an A/D converter, diagrammatically illustrated in FIG. 8, and with reference to results obtained from such an application, illustrated in FIG. 9.

Figure 8:
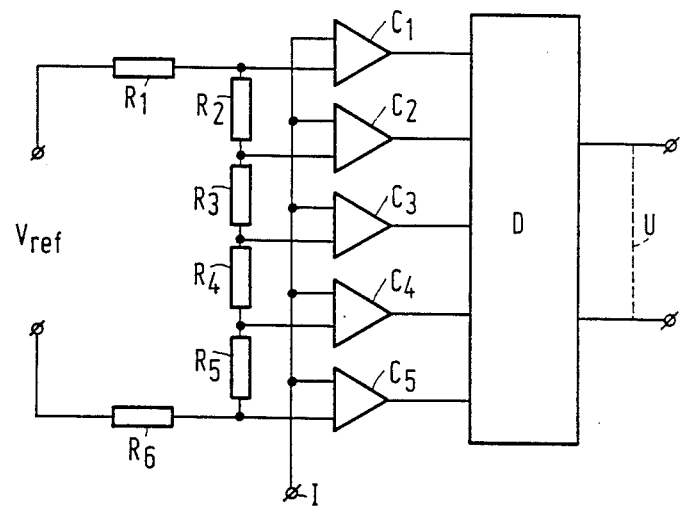

FIG. 8 illustrates a known application of a linear resistor in an A/D converter. The total linear resistor comprises the series arrangement of a plurality of sub-resistors R1 to R6, which series arrangement is connected to a reference voltage source Vref and derives fractional reference voltages therefrom which are applied to the one input of comparators C1 to C5 respectively, whilst the signal input voltage I is applied to the other input of the comparators, which input voltage is compared in the comparators with each of the different reference voltages. The result of the comparisons is converted by a decoder D into a digital value at the output U. For further details on such A/D converters reference is made to the generally known literature.

Figure 9:
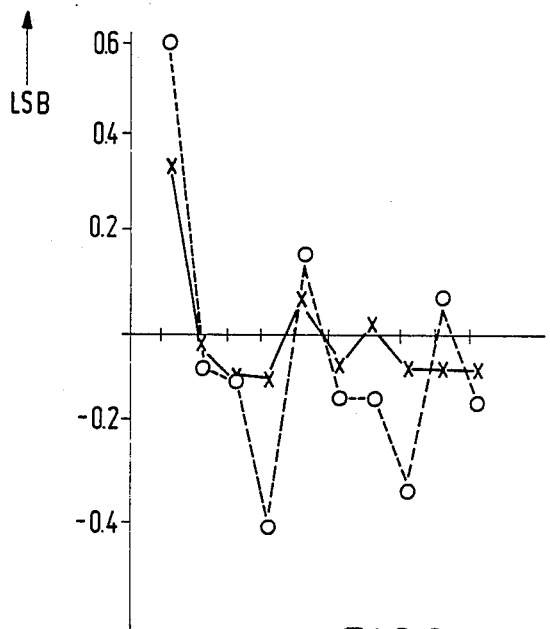

FIG. 9 shows the deviation of the fractional voltages with respect to the nominal value for a test circuit in which the arrangement of resistors R1 to R6 in FIG. 8 is realized with a tapped linear resistor according to the invention and further with a tapping contact pattern as illustrated in FIG. 5. The zero of the horizontal axis is at the edge of the end contact 12 and each graduation along the horizontal axis denotes the position of a tapping of the resistor. The various tapping points are denoted in a sequence on the horizontal axis and the deviation of the nominal voltage is plotted on the vertical axis as a fraction of the voltage which corresponds to the least significant bit LSB of the A/D converter. As is evident from the Figure, the linearity is better than 0.4 LSB at all tapping points without the use of the correction fingers at the end contacts, with the exception of a relatively strong non-linearity at the first tapping contact 14 directly adjacent the end contact 12 where the deviation is 0.6 LSB. By using the correction fingers 12a, 12b and 12c in particular the non-linearity for this last tapping contact 14 is considerably reduced and a further reduction of the non-linearities of the other tapping contacts is also realized so that the deviation of the nominal value is within ±0.1 LSB for most tapping contacts.

What is claimed is

1. A tapped linear integrated resistor, comprising a doped resistance body in a semiconductor substrate coated with a layer of insulating material having local apertures in which metal end contacts and tapping contacts are provided on the surface of the resistance body, characterized in that the width of each tapping contact is smaller than the width of the doped zone and in that, viewed in the longitudinal direction of the resistance body, the tapping contacts of adjacent tappings do not overlap.

2. A linear resistor as claimed in claim 1, characterized in that the tapping contacts are distributed in one or more groups of tapping contacts which are located within a partial surface of the resistance body and that, viewed in the longitudinal direction of the resistance body, they do not overlap within said partial surface.

3. A linear resistor as claimed in claim 2, characterized in that the dimensions of the tapping contacts as well as the number of tapping contacts in each group are such that the tapping contacts occupy all possible positions which are available for a group in the width direction of the resistance body.

4. A linear resistor as claimed in claim 1, characterized in that the tapping contacts are spread over the surface of the resistance body in such a way that the average space between a tapping contact and the adjacent tapping contact is as large as possible.

5. A linear resistor as claimed in claim 1, characterized in that the end contacts are formed as strips extending across the width of the doped zone and are each provided, on the side thereof facing the other end contact, with one or more projecting portions facing the other end contact ; such projecting portions perturbing the electric field in the resistance body in such a way that the field disturbance caused by the nearest tapping contacts is substantially eliminated.

6. A linear resistor as claimed in claim 5, characterized in that the tapping contacts are provided on the points of intersection of a raster constituted by imaginary longitudinal and transverse lines and in that the projecting portions of the end contacts consist of finger-shaped portions whose longitudinal dimensions are determined by the distance to the adjacent contact located on the same longitudinal line.

7. A linear voltage divider comprising series-arranged sub-resistors each having a known resistance, characterized in that the voltage divider is constituted by a tapped linear, integrated resistor as claimed in claim 1.

* * * * *